(12) United States Patent
Zhu et al.

(10) Patent No.: US 8,947,283 B2
(45) Date of Patent: Feb. 3, 2015

(54) SAMPLING FRONT-END FOR ANALOG TO DIGITAL CONVERTER

(71) Applicant: University of Macau, Macau (CN)

(72) Inventors: Yan Zhu, Macau (CN); Chi-Hang Chan, Macau (CN); Sai-Weng Sin, Macau (CN); Seng-Pan U, Macau (CN); Rui Paulo da Silva Martins, Macau (CN)

(73) Assignee: University of Macau, Macau (CN)

( * ) Notice: Subject to any disclaimer, the term of this patent is extended or adjusted under 35 U.S.C. 154(b) by 0 days.

(21) Appl. No.: 13/915,949

(22) Filed: Jun. 12, 2013

(65) Prior Publication Data

US 2014/0368363 A1    Dec. 18, 2014

(51) Int. Cl.
*H03M 1/12*  (2006.01)

(52) U.S. Cl.
CPC .................................. *H03M 1/1245* (2013.01)
USPC ........................................... 341/155; 341/122

(58) Field of Classification Search
CPC ................... H03M 2201/00; H03M 2201/20; H03M 1/12; H03M 2201/225; H03H 17/0416; H03H 17/0621
USPC .................................. 341/155, 144, 172, 163
See application file for complete search history.

(56) References Cited

U.S. PATENT DOCUMENTS

| | | | | |
|---|---|---|---|---|
| 5,835,049 A | * | 11/1998 | Nagaraj | 341/161 |
| 5,838,199 A | * | 11/1998 | Nakamura | 330/258 |
| 7,595,748 B2 | * | 9/2009 | Tu | 341/188 |
| 8,008,968 B2 | * | 8/2011 | Mandal | 330/9 |
| 8,659,461 B1 | * | 2/2014 | Zhu et al. | 341/156 |
| 2008/0204298 A1 | * | 8/2008 | Yamaji et al. | 341/155 |

OTHER PUBLICATIONS

Yan Zhu, Chi-Hang Chan, Sai-Weng Sin, Seng-Pan U, Rui Paulo da Silva Martins, "A 34fJ 10b 500 MS/s partial-interleaving pipelined SAR ADC," in Proc. of IEEE Symposium on VLSI Circuits—VLSIC 2012, pp. 90-91, Honolulu, USA, Jun. 13-15, 2012.
Chi-Hang Chan, Yan Zhu, Sai-Weng Sin, Seng-Pan U, Rui Paulo da Silva Martins, "A 3.8mW 8b 1GS/s 2b/cycle interleaving SAR ADC with compact DAC structure," in Proc. of IEEE Symposium on VLSI Circuits—VLSIC 2012, pp. 86-87, Honolulu, USA, Jun. 13-15, 2012.

* cited by examiner

*Primary Examiner* — Peguy Jean Pierre
(74) *Attorney, Agent, or Firm* — Bacon & Thomas, PLLC

(57) ABSTRACT

A sampling front-end for analog to digital converter is presented that shares a high speed N-bit ADC at front-end and interleaves the pipelined residue amplification with shared amplifier, which achieves high speed, low power and compact area with high density capacitive DAC structure.

8 Claims, 5 Drawing Sheets

SAMPLING FRONT-END FOR ANALOG TO DIGITAL CONVERTER

BACKGROUND OF THE INVENTION

1. Field of the Invention

The present invention is related to a sampling front-end with capacitive digital to analog converter, and in particular, to a time-interleaved front-end for analog to digital converter.

2. Description of the Related Art

Low power consumption and high speed analog to digital converters (ADCs) are highly demanded for battery-powered mobile applications. For the application of high speed, the time-interleaved scheme is commonly used, which usually suffers from sampling mismatches between different channels. Furthermore, the capacitive DAC structure utilizes in the ADC also affect the speed of the conversion in each ADC channels. A good architecture of ADC front-end will facilitate the timing issue, and a well design capacitive DAC can enhance the conversion speed of each channel.

SUMMARY OF THE INVENTION

The present invention is directed to a sampling front-end for analog to digital converter. The sampling front-end includes an N-bit ADC, the number of i Time-Interleaved (TI) residue amplification units and an amplifier.

According to an embodiment of the invention, the N-bit ADC samples an analog input signal; converts the input signal into N-bit digit and generates the residue. The N-bit ADC is shared by i TI residue amplification units.

According to an embodiment of the invention, the residue amplification units hold the residue from N-bit ADC to the amplifier, which are interleaved to i channels.

According to an embodiment of the invention, the amplifier amplifies the residue from one of the residue amplification units to $2^{nd}$ stage.

Accordingly, the present invention provides a sampling front-end for analog to digital converter having one N-bit ADC and one amplifier shared by i TI residue amplification units. Since the sampling front-end of N-bit ADC is shared by i residue amplification units, there exists no sampling mismatches. The time interleaving operation is performed only during the residue amplification, and the residues on the each residue amplification units are static. Thus, the timing mismatches are avoided.

According to the present invention, the capacitive digital-to-analog converter structure with low parasitic and high density layout structure can reduce the power and increase the speed of the conversion.

Further features and aspects of the present invention will become apparent from the following detailed description of embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 3c shows a schematic equivalent circuit of a capacitor array according to the embodiment of FIG. 3a.

DESCRIPTION OF THE EMBODIMENTS

Various exemplary embodiments, features, and aspects of the invention will be described in detail below with reference to the drawings. For the drawings below, the same or the similar numbers and symbols are referred to the same or the similar elements.

Figure 1:
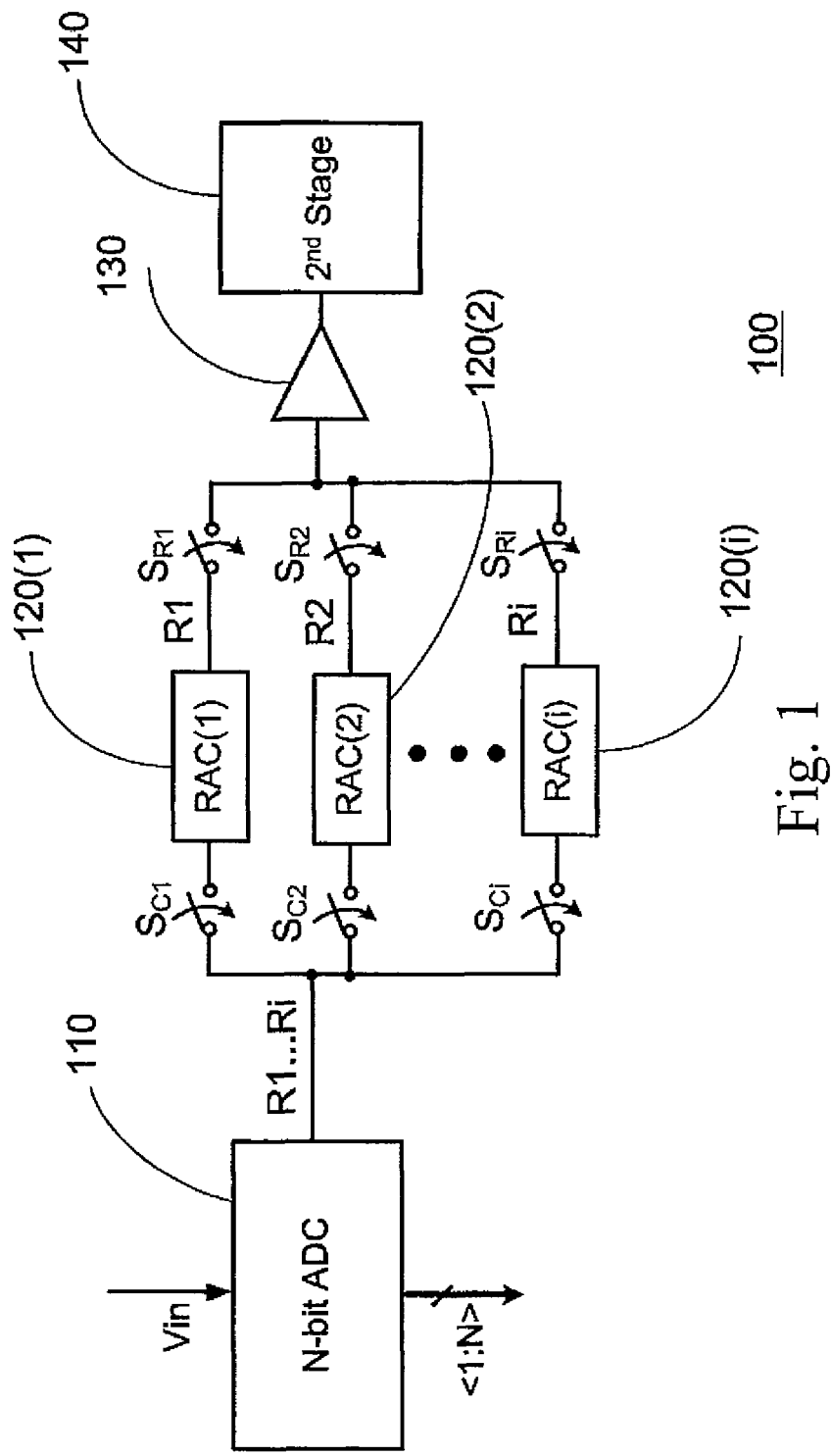
FIG. 1 shows a schematic view of function block of sampling front-end according to an embodiment of the invention.

FIG. 1 shows a schematic view of function block of a sampling front-end 100 according to an embodiment of the invention. Referring to FIG. 1, the sampling front-end 100 includes an N-bit ADC 110, i TI residue amplification units RAC(1) to RAC(i) 120(1)-120(i) and an amplifier 130.

According to an embodiment of the invention, the N bit ADC unit 110 receives an input analog signal Vin; samples and shares the input analog signal Vin to the $1^{st}$ residue sampling unit RAC(1) 120(1) via a switch $S_{C1}$. Then, the N bit ADC unit 110 converts the sampled input analog signal Vin into e.g. an N-bits digit and generates the residue voltage R1 at output. Since the switch $S_{C1}$ keeps on during the conversion, the residue R1 at the output of the N-bit ADC 110 is shared to the output of residue amplification unit 120(1). Therefore, the residue R1 can be also generated at the output of residue amplification unit 120(1). After the conversion, the N-bit ADC unit 110 disconnects to residue amplification unit 120(1) and connects to the $2^{nd}$ residue amplification unit 120(2) via switch $S_{C2}$ to start a new sampling and conversion. In the meantime, the $1^{st}$ residue amplification unit 120(1) connects to the amplifier 130 via switch $S_{R1}$ to amplify the residue R1 to $2^{nd}$ stage 140. The previous operation repeats i times. In addition, since the number of i TI residue amplification units 120(1)-120(i) share the same N-bit ADC 110 for the sampling, the time interleaved operation happens only in the residue amplification, the sampling mismatches are avoided.

The N-bit high speed ADC 110 can be a multi-bit per-cycle SAR ADC or an N-bit flash ADC. The architecture of the N-bit ADC 110 is prior art and we will not explain it deeply.

Figure 2:
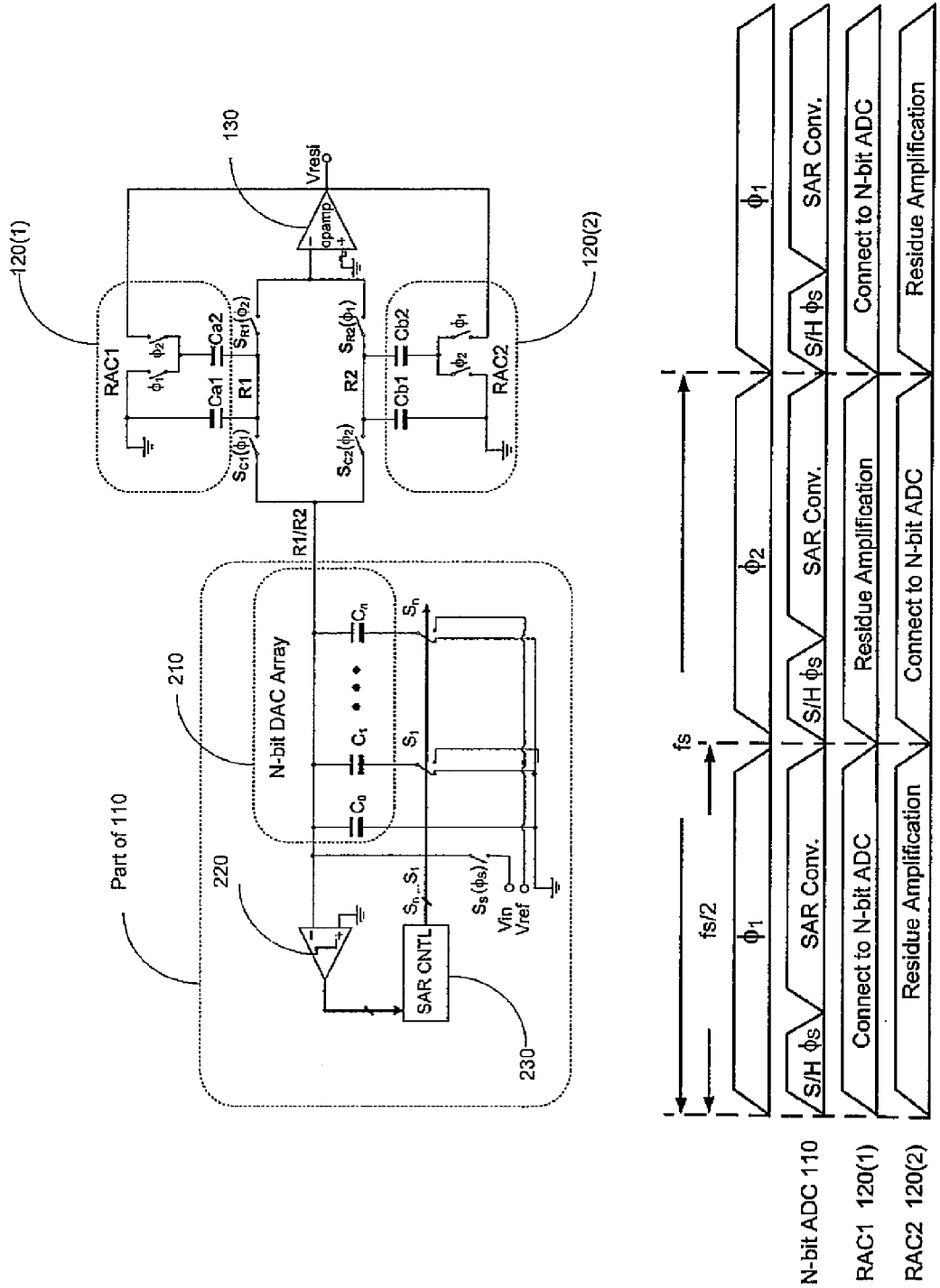
FIG. 2 shows a further schematic view of the sampling front-end and timing diagram according to an embodiment of the invention.

FIG. 2 shows a further detailed schematic view of the sampling front-end 100 according to an embodiment of the invention. Referring to FIG. 2, a part of the N-bit ADC 110 is shown. The N-bit ADC 110 includes an N-bit DAC array 210, a comparator 220 and a successive approximation register (SAR) controller 230. The DAC array 210 includes a plurality of capacitors $C_0$ to $C_n$ connected in parallel. Only two of the TI residue amplification units 120(1) to 120(i) in FIG. 1 are shown in FIG. 2. Each residue amplification unit 120(1)/120(2) includes two capacitors (e.g. Ca1 and Ca2 in 120(1) or Cb1 and Cb2 in 120(2)) connected in parallel.

According to an embodiment of the invention, during the sampling phase ($\phi s=1$ and $\phi 1=1$), the switches Ss and $S_{C1}$ are both on. The analog input signal is sampled onto the DAC array 210 and shared to the $1^{st}$ residue amplification unit 120(1) via switch $S_{C1}$. According to an embodiment of the invention, during the conversion phase ($\phi 1=1$) the switch Ss is off and the switch $S_{C1}$ keeps on. The SAR controller 230 controls the switches S1, S2 . . . Sn at the bottom-plate of the DAC array 210 according to the output of the comparator 220. The residue R1 at the top-plate of the DAC array 210 is successively approximated to the sampled input signal. The residue R1 is shared to the top-plate of the Ca1 and Ca2 via switch $S_{C1}$. The SAR controller may perform the multi-bit/per-cycle searching algorithm. The function how a SAR controller 230 works by cooperating with DAC array 210 and comparator 220 is prior art and we will not explain it deeply. According to an embodiment of the invention, during the next sampling phase ($\phi s=1$ and $\phi 2=1$), the switch $S_{C1}$ is off and the switch Ss, $S_{R1}$ $S_{C2}$ are one. The DAC array 210 is disconnected with the $1^{st}$ residue amplification unit 120(1) and connected to the $2^{nd}$ residue amplification unit 120(2) via switch $S_{C2}$ to start a new sampling. Simultaneously, the $1^{st}$ residue amplification unit 120(1) connects to the input of the amplifier 130 via switching $S_{R1}$ to amplify the residue R1 to the $2^{nd}$ stage.

The amplifier 130 amplifies the residue signal R1 and R2 from the residue amplification unit 120(1) and 120(2) respectively in two time-interleaved phases ($\phi 1$ and $\phi 2$). The inter stage gain of the amplifier 130 is decided according to how many capacitors are feedback to the output of the amplifier. For example, the inter-stage gain can be calculated as (Ca1+Ca2)/Ca2.

For good understanding, it is assumed that the DAC array 210 includes 4 capacitors $C_0$ to $C_3$ (i.e. n=3). The exemplary capacitances of the Capacitors $C_0$ to $C_3$ are provided as $C_0$=C0, $C_1$=3C0, $C_2$=12C0, and $C_3$=48C0, wherein C0 is referred to a specific value. It also assuming that the capacitors in RAC. The exemplary capacitance of Ca1, Ca2, Cb1 and Cb2 are provided as Ca1=Cb1=48C0, and Ca2=Cb2=16C0. The input signal is pre-charged at top-plate of entire array (DAC array 210) via switch Ss, which is bootstrapped and controlled by $\Phi$s. Since the time-interleaved switches ($S_{C1}$ and $S_{C2}$) are kept on until its corresponding conversion is completed, thereby no timing mismatches happen between two channels. During bit cycling, $1^{st}$ residue amplification unit 120(1) is involved in conversion in the N-bit ADC 110 and grounded to scale down the reference voltage (Vref) by 2, while another one $2^{nd}$ residue amplification unit 120(2) serves as a flip-around MDAC (multiplying digital-to-analog converter) that feeds back the Cb2 (16C0) to the output of the amplifier 130 for the ×4 residue amplification. The DAC array 210 is assigned as a segment thermometer-code array (a kind of capacitive array according to prior art) instead of the binary-weighted one to avoid the extra decode logic in the SAR controller 230 that reduces the loop delay. The DAC array 210 and each residue amplification unit 120 contain the same total units of capacitance (e.g. 64C0) that is determined by the thermal noise.

Figure 3A:
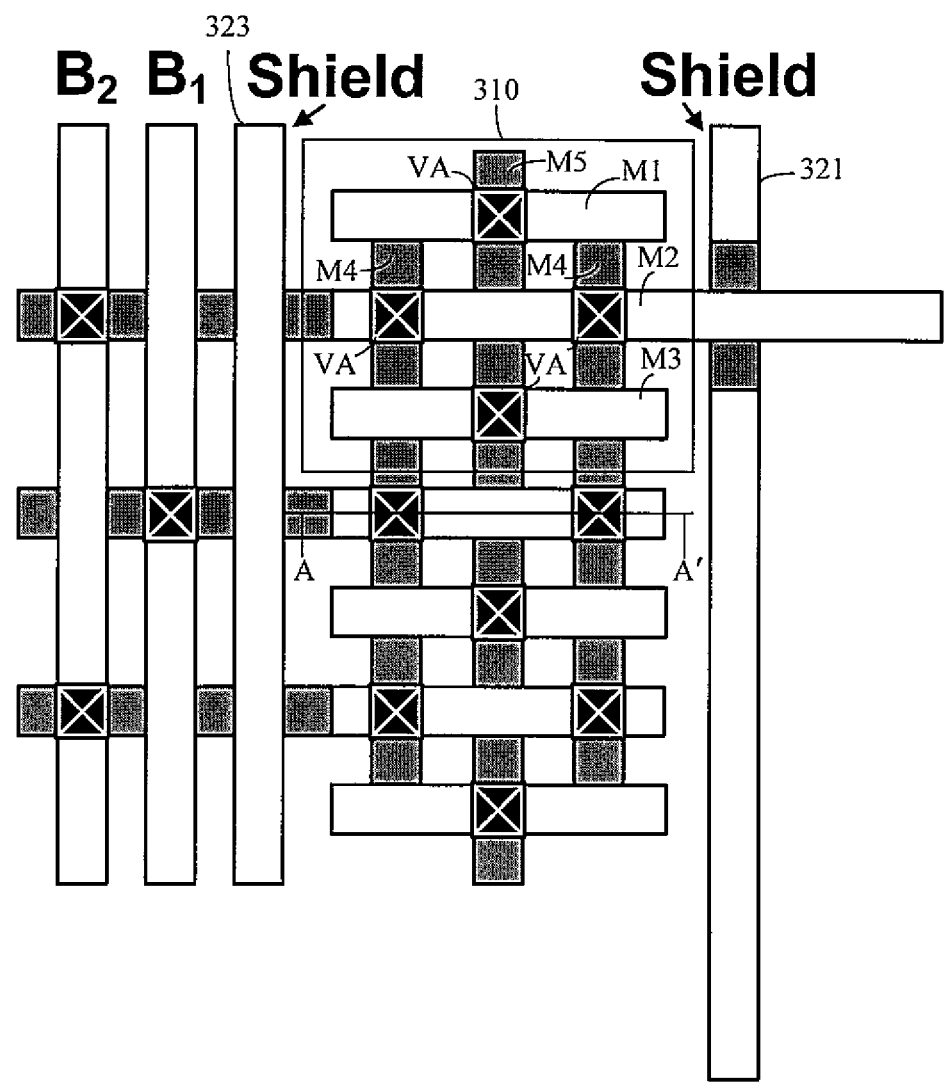
FIG. 3a shows a schematic layout view of a compact capacitor array according to an embodiment of the invention.

Since there are capacitor arrays used in the design of the sampling front-end 100 such as the N-bit DAC array 210 and the residue amplification units 120, a compact design for the capacitor arrays is adaptive to the sampling front-end 100 of the present invention. Preferably, the capacitor arrays may be implemented in one semiconductor chip. FIG. 3a shows a schematic layout view of a compact capacitor array 300 according to an embodiment of the invention. Referring to FIG. 3a, the compact capacitor array 300 includes a plurality of capacitors 310. For avoiding unnecessary coupling, the compact capacitor array 300 further includes metal shields. According to an embodiment of FIG. 3a, there are two metal shields 321, 323 disposed two different sides of the compact capacitor array 300.

Specifically, the capacitors can be multilayer devices (e.g. a first layer, a second layer, and a third layer) and one of the capacitors 310 includes three parallel pairs of metals M1, M2, M3 wherein each pair of metals (M1-3) are disposed in parallel on different semiconductor layers respectively. In other words, one metal of each pair of metals (M1-3) may be disposed on the first layer and the other metal of each pair of metals M1-3 may be disposed on the second layer. In addition, the three pairs of metals M1-3 may be parallel to one another. Two metal stubs M4 and a cross metal M5 may be disposed in the third layer interposed between the first layer and the second layer. Wherein, the two metal stubs M4 are disposed at two ends of the metal M2 respectively and the two metal stubs M4 are electrically connected to the pair of metals M2 through contacts VA. Moreover, the cross metal M5 in the third layer is substantially intersected with the three pairs of metals M1-3 and the cross metal M5 is stretched across the three pairs of metals M1-3 in the center. Additionally, the cross metal M5 is electrically connected to the pairs of metals M1 and M3 through contacts VA.

It is noticeable that each of the capacitors 310 includes two terminals, wherein one terminal (e.g. M4) of each of the capacitors 310 may be connected to a different connection point of multiple connection points (e.g. B1 or B2) and the other terminal of each of the capacitors 310 shares the same terminal (e.g. M5). Therefore, the cross metal M5 is not only connected to the metal M1 and the metal M3 in one capacitor, but the cross metal M5 is connected to all the metals M1 and all the metals M3 throughout all the capacitors of the capacitor array 300. In other words, the metal M5 is a common shared connection point to which all the capacitors (310) are connected. Since the implemented capacitor array 300 has one terminal (M5) shared, the plurality of the capacitors (310) can be a compact capacitor array by nature through the shared terminal (M5) without additional routing. Thus, the capacitor array 300 with the plurality of capacitors 310 has the characteristic of one terminal shared, and this structure allows high capacitive density with reduced undesired parasitic effects.

Figure 3B:
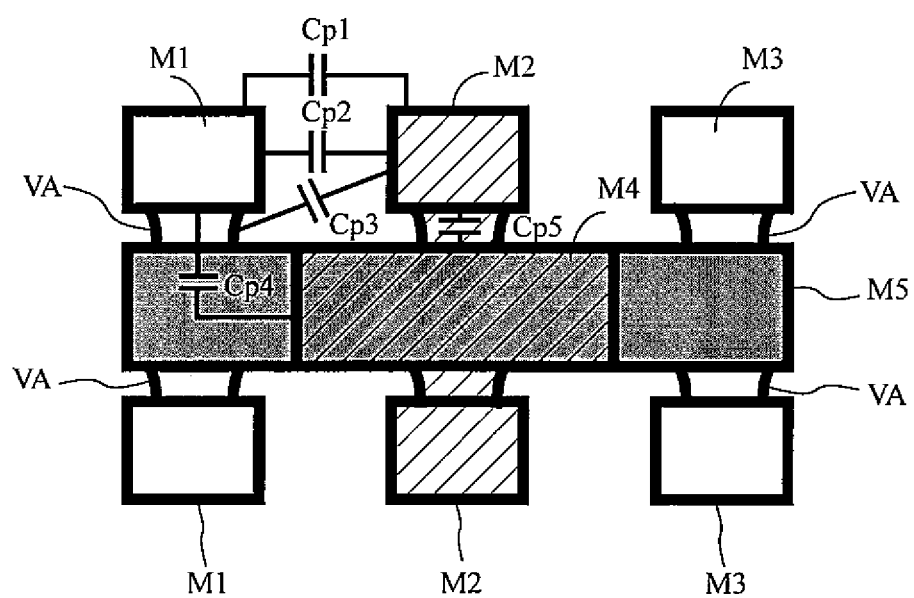
FIG. 3b shows a cross section view of a capacitor 310 of FIG. 3a along the line A-A' according to an embodiment of the invention.

FIG. 3b shows a cross section view of a capacitor 310 of FIG. 3a along the line A-A' according to an embodiment of the invention. As shown in FIG. 3b, the capacitance of one capacitor 310 may be formed of several parasitic capacitances which are obtained from lateral fields and vertical fields between metals or contacts or the combination thereof. For example, a parasitic capacitance (e.g. Cp1) may parasite between top surfaces of the metals (e.g. M1, M2, M3) on the same layer, a parasitic capacitance (e.g. Cp2) may parasite between side surfaces of the metals (e.g. M1, M2, M3) on the same layer, a parasitic capacitance (e.g. Cp3) may parasite between side surfaces of the metals (e.g. M1, M2, M3) and the contacts VA, a parasitic capacitance (e.g. Cp4) may parasite between bottom surfaces of the metals (e.g. M1, M3) and side surfaces of the metal stubs (e.g. M4), and a parasitic capacitance (e.g. Cp5) may parasite between bottom surfaces of the metals (e.g. M2) and top surfaces of the metal stubs (e.g. M4). Accordingly, the entire capacitance of the capacitor 410 may be substantially formed of the capacitances e.g. Cp1 to Cp5.

Figure 3C:
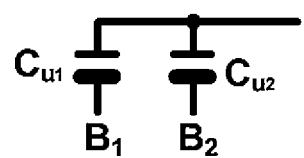

For a practical example, while a connection point B1 is required to be connected to a capacitor with a capacitance C0, the connection point B1 is connected to a capacitor 310 through one contact and one metal. For another example, while a connection point B2 is required to be connected to a capacitor with a capacitance 2C0, the connection point B2 is connected to two capacitors 310 through two contacts and two metals. As described above, if the connection points B1 and B2 are connected to the same capacitor array, an equivalent circuit is formed as shown in FIG. 3c, wherein a capacitor CU1 is connected to the connection point B1 with a capacitance C0 and a capacitor CU2 is connected to the connection point B2 with a capacitance 2C0. In addition, since pairs of metals M1-3 of the capacitor 310 are disposed on two layers, the metal shields may also be disposed in the first layer or the second layer.

In summary, the present invention presents a sampling front-end for analog to digital converter which includes an N-bit ADC, the number of i residue amplification units and an amplifier. While the N-bit ADC is used to convert a sampled input signal and share the residue to the time-interleaved residue amplifier units. The sampling front-end is implemented with an N-bit high-speed ADC, while only the residue amplification is time-interleaved. Thus, the sampling mismatches are prevented. Moreover, the signals (the residue R1-Ri) at the TI residue amplification units are static, there are no timing mismatches between i channels. In addition, a compact capacitor array design is applied to the sampling front-end for analog to digital converter of the invention. In this way, the present invention achieves high resolution, high speed, low power dissipation and compact area.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. A sampling front-end, comprising:
   an N-bit ADC (analog to digital), sampling an input analog signal; converting the sampled input analog signal into an N-bit digit and generating the residues that are shared by i residue amplification units
   i residue amplification units, retrieving the time interleaved residue signals from the N-bit ADC unit
   an amplifier, generating an amplifying signal by amplifying the residue signal received from the residue amplification units;
   wherein the residue amplification units hold the residue from the N-bit ADC to the amplifier, which are interleaved to i channels.

2. The sampling front-end as claimed in claim 1, wherein the N-bit ADC unit is shared by i TI residue amplifier units.

3. The sampling front-end as claimed in claim 1, wherein the N-bit ADC unit comprises a SAR (successive approximation register) controller which is provided to operate with the converting speed of multi-bit bits per cycle.

4. The sampling front-end as claimed in claim 1, wherein the N-bit ADC unit comprises at least one DAC (digital/analog conversion) array, wherein the DAC array comprises a capacitor array.

5. The sampling front-end as claimed in claim 1, wherein the residue amplification units comprise at least two residue amplification capacitor (RAC) array which comprises a plurality of capacitors and wherein when the amplifier is amplifying the residue signal, at least one of the capacitors of the residue sampling unit is coupled to the output of the amplifier so that a feedback loop is formed.

6. The sampling front-end as claimed in claim 1, wherein the analog to digital converter comprises a plurality of capacitor arrays inside the N-bit ADC unit, the residue amplification unit, and wherein the capacitor arrays are formed in a semiconductor chip.

7. The sampling front-end as claimed in claim 6, wherein each of the capacitor arrays comprises a plurality of capacitors, and the plurality of capacitors in one capacitor array have one terminal shared.

8. The sampling front-end as claimed in claim 7, wherein each of the plurality of the capacitors comprises pairs of metals, metal stubs and contacts for the contact between metals on different layers, and at least a cross metal which is substantially intersected with the pairs of metals, wherein an entire capacitance of one of the capacitors is formed of a parasitic capacitance between top surfaces of the metals, a parasitic capacitance between side surfaces of the metals, a parasitic capacitance between side surfaces of the metals and the contacts, a parasitic capacitance between bottom surfaces of the metals and side surfaces of the metal stubs, and a parasitic capacitance between bottom surfaces of the metals and top surfaces of the metal stubs, wherein one terminal is shared without extra routing in the unit capacitor, whereby a low parasitic and high density structure is obtained.

* * * * *